United States Patent
Bay et al.

(10) Patent No.: US 7,242,244 B2
(45) Date of Patent: Jul. 10, 2007

(54) METHOD AND ARRANGEMENT FOR TESTING A POWER OUTPUT STAGE

(75) Inventors: Wolfgang Bay, Frankfurt am Main (DE); Patrick Fischer, Hanau (DE); Michael Henninger, Kelkheim (DE)

(73) Assignee: Siemens Aktiengesellschaft, München (DE)

( * ) Notice: Subject to any disclaimer, the term of this patent is extended or adjusted under 35 U.S.C. 154(b) by 494 days.

(21) Appl. No.: 10/842,119

(22) Filed: May 10, 2004

(65) Prior Publication Data

US 2004/0257017 A1 Dec. 23, 2004

(30) Foreign Application Priority Data

May 9, 2003 (DE) .................. 103 20 926

(51) Int. Cl.
*G01R 19/00* (2006.01)
*H03F 3/00* (2006.01)

(52) U.S. Cl. .................. 330/2; 330/146; 330/251

(58) Field of Classification Search .................. None
See application file for complete search history.

(56) References Cited

U.S. PATENT DOCUMENTS 6,586,899 B2    7/2003    Joch 6,661,285 B1 *  12/2003   Pompei et al. ............ 330/251
7,132,884 B2 *  11/2006   Ohkuri et al. ............ 330/10

* cited by examiner

Primary Examiner—Khanh Van Nguyen
(74) Attorney, Agent, or Firm—Cohen Pontani Lieberman & Pavane LLP

(57) ABSTRACT

An arrangement for testing a power output stage, with the power output stage includes at least one half bridge with an upper semiconductor switch and a lower semiconductor switch connected in series and to which an operating voltage is applied. A junction point between the semiconductor switches of the at least one half bridge forms an output. A control device performs a test to determine whether the voltage at the output is within a predetermined central tolerance band when the semiconductor switches are not switched on, a test to determine whether the voltage at the output is within a predetermined upper tolerance band when the upper semiconductor switch is switched on, and a test to determine whether the voltage at the output is within a predetermined lower tolerance band when the lower semiconductor switch is switched on. The power output stage is identified as being sound when all of the output voltages are within the respective tolerance bands.

14 Claims, 1 Drawing Sheet

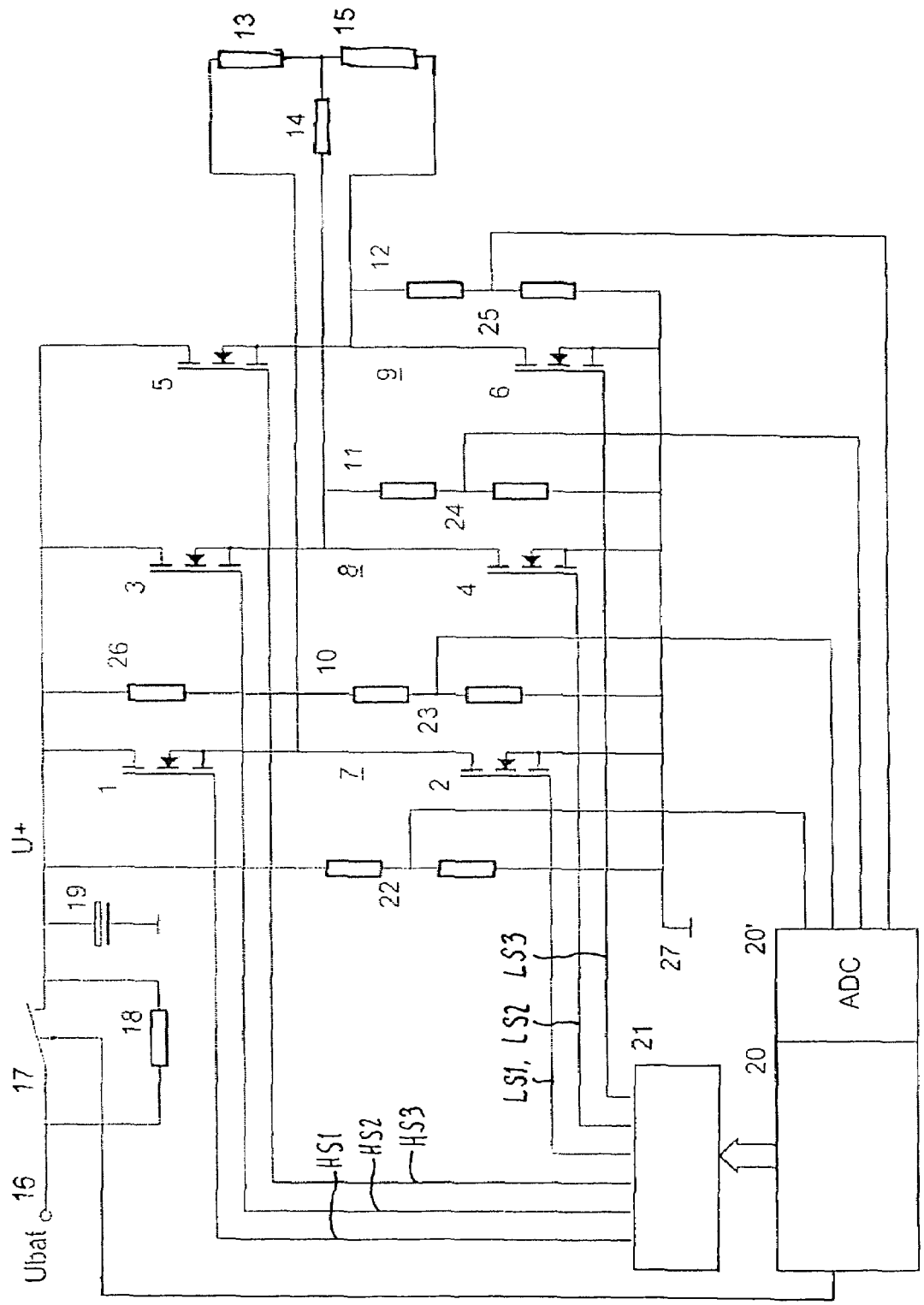

METHOD AND ARRANGEMENT FOR TESTING A POWER OUTPUT STAGE

BACKGROUND OF THE INVENTION

1. Field of the Invention

The present invention relates to a method and an arrangement for testing a power output stage, wherein the power output stage includes at least one half bridge with an upper and a lower semiconductor switch connected in series and to which an operating voltage is applied, and wherein a junction point between the semiconductor switches in the at least one half bridge forms an output.

2. Description of the Related Art

Power output stages which are fitted with semiconductor switches are used, inter alia, in motor vehicles for driving loads such as, for example, DC motors. The rapid development of low-impedance power MOSFETs allows even loads in the kilowatt range to be driven at low cost. In motor vehicles, it is possible for the power output stage and the load to be arranged physically separately from one another, in which case short circuits from the load supply lines to ground or to the battery voltage may lead to high fault currents. Fuse links can generally not be used in these circuits owing to their tolerances, their internal resistances and the high currents that are used. Furthermore, a defective MOSFET in the power output stage can produce a high fault current.

SUMMARY OF THE INVENTION

The object of the present invention is to provide a test for power output stages such that, in the event of a short circuit, the operating voltage is switched off, or is not switched on at all in the first place, thus protecting the power output stage and the vehicle power supply system against damage.

The object is met by a method according to the present invention carried out by control device and including the steps of:

testing the power output stage to determine whether the voltage at an output is within a predetermined central tolerance band when the semiconductor switches of the power output stage are not switched on, testing the power output stage to determine whether the voltage at the output is within a predetermined upper tolerance band when the upper semiconductor switch is switched on, testing the power output stage to determine whether the voltage at the output is within a predetermined lower tolerance band when the lower semiconductor switch is switched on, and identifying that the power output stage is sound when all of the output voltages are within the respective tolerance band.

In a preferred embodiment of the present invention, the operating voltage may be supplied by a current-limiting device before and during the tests. In this embodiment, the operating voltage is supplied without current limiting once the power output stage has been identified as being sound.

During the test, the semiconductor switches may be switched on briefly in such a manner that not only does no damage occur but the load is not influenced, or is influenced only insignificantly, during the test as well. Once the power output stage has been identified as being sound, the semiconductor switches are supplied with the drive pulses which are intended for normal operation. With the normal semiconductor switches, a switch-on time of less than about 1 to 2 ms may be expedient.

Only a small number of additional resistors and inputs for analog/digital converters, which are provided in any case in the control devices, are required to carry out the method according to the present invention. Together with a suitable program in the control device, these analog/digital converters represent window comparators, which may also be implemented in a different way.

The method according to the present invention allows the state of the power output stage to be assessed in a differentiated manner, with the load, for example a motor, in each case not being influenced, or being influenced only insignificantly, during the test. The test can be carried out automatically on each occasion before the power output stage is switched on, for example on operation of the ignition key of a motor vehicle, or else during operation.

The method according to the present invention may be carried out on power output stages with one or more half bridges. In the case of a method in which the power output stage has at least two half bridges, the invention provides that the tests during which the upper and the lower semiconductor switches are switched on are carried out successively for each of the semiconductor switches in the individual half bridges. This method also allows the identification of line discontinuities between the outputs and a load by evaluation of the output voltages during the test of the various half bridges.

The object of the present invention is also achieved by an arrangement in which the output voltage of at least one half bridge and the operating voltage of a power output stage are supplied to inputs of window comparators which are connected to a control device which controls a drive circuit for semiconductor switches of the power output device, and in that the control device is provided with a program for performing the following steps:

testing the power output stage to determine whether the voltage at an output is within a predetermined central tolerance band when the semiconductor switches of the power output stage are not switched on, testing the power output stage to determine whether the voltage at the output is within a predetermined upper tolerance band when the upper semiconductor switch is switched on, testing the power output stage to determine whether the voltage at the output is within a predetermined lower tolerance band when the lower semiconductor switch is switched on, and identifying that the power output stage is sound when all of the output voltages are within the respective tolerance band.

The window comparators of the arrangement according to the present invention may be formed by analog/digital converters whose output values are compared in the control device with the tolerance bands.

Since the operating voltage for the power output stages is generally considerably higher than that for microprocessors or digital signal processors, the connections of the output of the at least one half bridge and of the operating voltage to the inputs of the window comparators are provided by voltage dividers in the arrangement according to the present invention.

To ensure that there is a reproducible voltage at the output when the semiconductor switches are switched off, the arrangement according to the present invention includes means for producing an output voltage in the predetermined central tolerance band when the semiconductor switches are switched off. The means are preferably formed by a resistor, which is connected between the output and the operating voltage source and which, together with the voltage divider, produces a voltage in the central tolerance band at the output. Other suitable means for providing this voltage comprise the use of appropriate gate drivers.

If at least two half bridges maybe provided, only one or more of which may have the means which result in the respective output voltage being in the predetermined central tolerance band when the semiconductor switches are switched off.

A test without overloading the power output stage and the devices for the voltage supply is possible by providing a controllable switch and a resistor connected in parallel in the supply line for the operating voltage. The controllable switch may be controlled by the control device. Instead of providing the controllable switch, the arrangement according to the present invention may be operable so that the pulses which are used for the test are sufficiently short such that the semiconductor switches are not overloaded.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing is a circuit diagram of an arrangement according to the present invention in which the power output stage is formed by three half bridges.

DETAILED DESCRIPTION OF THE PRESENTLY PREFERRED EMBODIMENTS

In the illustrated exemplary embodiment according to the drawing, a power output stage includes three half bridges 7, 8, and 9. Each respective one of the half bridges 7, 8, 9 includes two MOSFETs 1, 2; 3, 4; and 5, 6, and an output 10, 11, 12. Windings 13, 14, 15 (which are connected in star) of a motor are respectively connected to the outputs 10, 11, 12. An input 16 is supplied with the operating voltage Ubat which, as U+, is supplied via a relay 17 to the power output stage. A current limiting resistor 18 is connected in parallel with the relay 17, via which a high-capacitance electrolytic capacitor 19 can be charged. The relay 17 is not switched on until the voltage U+corresponds approximately to the voltage Ubat. The current limiting resistor avoids an unacceptably high charging current surge. Details of this known circuit are contained in U.S. Pat. No. 6,586,899.

The arrangement also has a control device 20 which is known per se in conjunction with power output stages, is formed by a microcomputer or a digital signal processor, and need not be explained in any more detail as such for understanding of the invention. Outputs of the control device 20 are connected to a drive circuit 21, which produces control signals HS1, HS2, HS3, LS1, LS2, LS3 for the MOSFETs 1 to 6. The control device 20 is also connected to analog/digital converters 20', whose inputs can be supplied with voltages which are in each case produced by a voltage divider 22, 23, 24, 25. The voltage dividers have considerably higher resistances than the windings 13, 14, 15 to avoid reducing the efficiency of the output stage during operation.

A resistor 26 is connected in parallel with the MOSFET 1 and, together with the voltage divider 23, results in half of the voltage U+being produced at the output 10 of the half bridge 7 when the MOSFETs 1, 2 are not switched on.

The voltage dividers 22 to 25 are designed such that the maximum permissible voltage for CMOS circuits is not exceeded at the maximum possible value of U+. The voltage which is produced by the voltage divider 22 is used as a voltage reference, in order to form the tolerance bands, for the following described individual tests.

In the first test, the MOSFETs 1 to 6 are not driven, so that the output 10 is at the voltage U+/2, and this is checked in the control device 20, taking into account a specified tolerance. If the voltage at output 10 is at U+/2, it can be concluded that there is no short circuit to ground 27 or to the operating voltage U+ in the MOSFETs 1, 2 or in the supply line to the winding 13. The MOSFETs 3 to 6 are not switched on during this first test either, so that the voltages at the outputs 11, 12, via the windings 13 to 15 of the motor, are likewise in the central tolerance band, and this is checked by the control device 20. If all the outputs are within the central tolerance band, the power output stage is sound.

In a second test, the "upper" MOSFETs 1, 3, 5 are switched on successively and a check is carried out in each case to determine whether the outputs 10, 11, 12 are at a voltage which is in an upper tolerance band, that is to say in the vicinity of the voltage U+. In a third test, the "lower" MOSFETs 2, 4, 6 are switched on successively. A check is then carried out in each case to determine whether the voltage at the outputs 10, 11, 12 is in the lower tolerance band, that is to say compared with U+, in the vicinity of the ground potential. The nature of the defect, for example a short circuit or an overload, may be deduced from the extent to which the respective tolerance band is exceeded or undershot.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for testing a power output stage, the power output stage having at least one half bridge including an upper semiconductor switch and a lower semiconductor switch connected in series and to which an operating voltage is applied, and a control device operatively connected to the upper and lower semiconductor switches of the power output stage, wherein a junction point between the upper and lower semiconductor switches of the at least one half bridge form an output of the power output stage, said method comprising the steps of:

performing, by the control device, a first test of the power output stage to determine whether the voltage at the output is within a predetermined central tolerance band when the first and second semiconductor switches of the at least one half bridge are not switched on;

performing, by the control device, a second test to determine whether the voltage at the output is within a predetermined upper tolerance band when the upper semiconductor switch of the at least one half bridge is switched on;

performing, by the control device, a third test to determine whether the voltage at the output is within a predetermined lower tolerance band when the lower semiconductor switch of the at least one half bridge is switched on; and identifying, by the control device, the power output stage as being free from defects which cause fault currents when the output voltage is within the respective tolerance bands in each of the first, second and third tests.

2. The method of claim 1, further comprising the steps of supplying the operating voltage to the power output stage using a current-limiting device before and during the first, second and third tests, and supplying the operating voltage without the current-limiting device once the power output stage has been identified as being free from defects which cause fault currents.

3. The method claim 1, further comprising the steps of switching the upper and lower semiconductor switches of the at least one half bridge on sufficiently briefly during the first, second and third tests such that no damage occurs to the load if a fault is present and so that the load is only insignificantly loaded during the first, second and third tests, and supplying the upper and lower semiconductor switches of the at least one half bridge with drive pulses intended for normal operation once the power output stage has been identified as being free from defects which cause fault currents.

4. The method of claim 1, wherein the power output stage has at least two half bridges, wherein each of the second and third tests during which the upper and the lower semiconductor switches are switched on are carried out successively for each of the upper and lower semiconductor switches in the at least two half bridges.

5. The method of claim 4, wherein line discontinuities between the outputs and a load are identified by evaluation of the output voltages during testing of the at least two half bridges.

6. An arrangement for testing a power output stage, comprising:

an operating voltage input for receiving an operating voltage;

at least one half bridge comprising an upper semiconductor switch and a lower semiconductor switch connected in series and connectable to the operating voltage, and a junction point between the upper and lower semiconductor switches of the at least one half bridge forming an output;

a control device controlling a drive circuit for said upper and lower semiconductor switches;

window comparators including inputs connected to the output of the at least one half bridge and the input for receiving the output voltage of the at least one half bridge and the operating voltage;

said control device comprising:

means for performing a first test of said power output stage to determine whether the voltage at the output of said at least one half bridge is within a predetermined central tolerance band when upper and lower semiconductor switches of the at least one half bridge are not switched on;

means for performing a second test to determine whether the voltage at the output of said at least one half bridge is within a predetermined upper tolerance band when the upper semiconductor switch of said at least one half bridge is switched on;

means for performing a third test to determine whether the voltage at the output of said at least one half bridge is within a predetermined lower tolerance band when the lower semiconductor switch of said at least one half bridge is switched on; and means for identifying said power output stage as being free from defects which cause fault currents when the output voltage of said at least one half bridge is within the respective tolerance bands in each of the first, second and third tests.

7. The arrangement of claim 6, wherein said window comparators comprise analog/digital converters generating output values, said control device comprising means for comparing said output values of said analog/digital converters with the tolerance bands.

8. The arrangement of claim 6, further comprising voltage dividers for respectively connecting the output of said at least one half bridge and said operating voltage input to the inputs of said window comparators.

9. The arrangement of claim 8, further comprising means for producing an output voltage at said output of said at least one half bridge in the predetermined central tolerance band when the semiconductor switches are switched off.

10. The arrangement of claim 9, wherein said means for producing an output voltage comprise a resistor connected between said output of said at least one half bridge and said operating voltage input, said resistor and said voltage divider produce a voltage in the central tolerance band at said output of said at least one half bridge.

11. The arrangement of claim 9, wherein said at least one half bridge comprises at least two half bridges, and only one of said at least two half bridges includes said means for producing an output voltage.

12. The arrangement of claim 9, wherein said at least one half bridge comprises at least two half bridges, and each of said at least two half bridges includes said means for producing an output voltage.

13. The arrangement of claim 6, further comprising a controllable switch connected between said operating voltage input and said at least one half bridge, and a resistor connected in parallel with said controllable switch, said control device being operatively connected to said controllable switch for controlling said controllable switch.

14. The arrangement of claim 6, further comprising means for producing an output voltage at said output of said at least one half bridge in the predetermined central tolerance band when the semiconductor switches are switched off.

* * * * *